(12) United States Patent
Martin et al.

(10) Patent No.: US 7,888,844 B2
(45) Date of Patent: Feb. 15, 2011

(54) TEMPERATURE CONTROL OF MICROMACHINED TRANSDUCERS

(75) Inventors: David Martin, Fort Collins, CO (US); Donald Lee, Fort Collins, CO (US); John Choy, Westminster, CO (US); Joel Philliber, Fort Collins, CO (US); Osvaldo Buccafusca, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/570,298

(22) Filed: Sep. 30, 2009

(65) Prior Publication Data

US 2010/0327702 A1    Dec. 30, 2010

Related U.S. Application Data

(63) Continuation-in-part of application No. 12/495,443, filed on Jun. 30, 2009, now abandoned.

(51) Int. Cl.
    *H01L 41/08* (2006.01)
(52) U.S. Cl. .................. 310/324; 310/320; 310/369
(58) Field of Classification Search .............. 310/320, 310/324, 369
    See application file for complete search history.

(56) References Cited

U.S. PATENT DOCUMENTS

| | | | |
|---|---|---|---|
| 5,587,620 A | 12/1996 | Ruby et al. | |
| 5,736,430 A | 4/1998 | Seefeldt et al. | |
| 5,873,153 A | 2/1999 | Ruby et al. | |
| 6,217,979 B1 * | 4/2001 | Takeuchi et al. | 428/138 |
| 6,320,239 B1 | 11/2001 | Eccardt et al. | |
| 6,384,697 B1 | 5/2002 | Ruby | |
| 6,507,983 B1 | 1/2003 | Ruby et al. | |
| 6,828,713 B2 | 12/2004 | Bradley et al. | |
| 7,275,292 B2 | 10/2007 | Ruby et al. | |
| 7,290,336 B2 * | 11/2007 | Buhler et al. | 29/890.1 |
| 7,329,933 B2 | 2/2008 | Zhe et al. | |
| 7,400,737 B2 | 7/2008 | Pedersen | |
| 7,427,819 B2 | 9/2008 | Hoen et al. | |
| 7,561,009 B2 | 7/2009 | Larson, III et al. | |
| 2001/0035700 A1 * | 11/2001 | Percin et al. | 310/324 |
| 2006/0103492 A1 | 5/2006 | Feng et al. | |
| 2007/0125161 A1 | 6/2007 | Bryzek et al. | |
| 2007/0205850 A1 | 9/2007 | Jamneala et al. | |
| 2007/0284682 A1 | 12/2007 | Laming et al. | |
| 2008/0122317 A1 | 5/2008 | Fazzio et al. | |
| 2008/0122320 A1 | 5/2008 | Fazzio et al. | |
| 2008/0192963 A1 | 8/2008 | Sato | |
| 2008/0258842 A1 | 10/2008 | Ruby et al. | |
| 2008/0292888 A1 | 11/2008 | Hucker et al. | |

OTHER PUBLICATIONS

Beeby, et al. "MEMS Mechanical Sensors", Microelectromechanical System Series, Artech House, Inc., Boston (2004).
Notice of Allowance dated Dec. 2, 2009 in U.S. Appl. No. 11/291,674.

* cited by examiner

*Primary Examiner*—Thomas M Dougherty

(57) ABSTRACT

A micromachined structure, comprises a substrate and a cavity in the substrate. The micromachined structure comprises a membrane layer disposed over the substrate and spanning the cavity.

13 Claims, 8 Drawing Sheets

TEMPERATURE CONTROL OF MICROMACHINED TRANSDUCERS

CROSS-REFERENCE TO RELATED APPLICATIONS

The present application is a continuation-in-part under 37 C.F.R. §1.53(b) of commonly owned U.S. patent application Ser. No. 12/495,443, entitled "Piezoelectric Micromachined Transducers" to David Martin, et al., and filed on Jun. 30, 2009. Priority to the cross-referenced parent application is claimed in accordance with 35 U.S.C. §120, and the entire disclosure of U.S. patent application Ser. No. 12/495,443 is specifically incorporated herein by reference.

BACKGROUND

Transducers such as ultrasonic transducers are provided in a wide variety of electronic applications. As the need to reduce the size of many components continues, the demand for reduced-size transducers continues to increase as well. This has lead to comparatively small transducers, which may be micromachined according to technologies such as microelectromechanical systems (MEMS) technology. One type of transducer is a piezoelectric micromachined transducer (PMT). The PMT includes a layer of piezoelectric material between two conductive plates (electrodes) thereby forming a membrane. When functioning as a receiver, an acoustic wave incident on the membrane results in the application of a time varying force to the piezoelectric material. Application of the time-varying force to a piezoelectric material results in induced stresses in the piezoelectric material, which in-turn creates a time-varying voltage signal across the material. This time-varying voltage signal may be measured by sensor circuits to determine the characteristics of the incident acoustic wave. Alternatively, this time-varying voltage signal may produce a time-varying charge that is provided to sensor circuits that process the signal and determine the characteristics of the incident acoustic wave. When functioning as a transmitter, a voltage excitation produces vibration of the diaphragm. This in turn radiates acoustic energy into the air (or any gaseous medium).

Ultrasonic devices, such as ultrasonic transducers, typically operate at a resonance condition to improve sensitivity in both receive mode and transmit mode. Accordingly, it is useful for the transducer to function at a comparatively accurate resonant frequency, and for multiple transducers designed for use at the selected resonant frequency to be fabricated with such accuracy with repeatability. One drawback to many known PMT structures relates to a lack of repeatability of the resonance frequency from PMT to PMT. To this end, PMTs for certain applications, such as mics rely on the flexure mode of the membrane rather than longitudinal modes. While the resonant frequency of longitudinal modes is not significantly affected by film stress, the resonant frequency of flexural modes is highly dependent on film stress. Thus, variation in film stress can impact the operational characteristics of transducers designed for flexural mode operation.

Another source of stress in PMTs is temperature. As is known, every material has a coefficient of thermal expansion ($T_{CE}$). Thus a material expands or contracts in proportion to this coefficient. The expansion or contraction of a material induces stress in the material, and mismatches in $T_{CE}$ between different materials comprising the PMT will result in stress in the membrane layer. The stress in the membrane layer can impact the resonance frequency and the sensitivity of the membrane and thereby the PMT.

There is a need, therefore, for a transducer structure that addresses at least the shortcomings described above.

SUMMARY

In accordance with an illustrative embodiment, a micromachined structure, comprises a substrate having a first coefficient of thermal expansion. The micromachined structure comprises a cavity in the substrate and a membrane layer having a second coefficient of thermal expansion and disposed over the substrate and spanning the cavity, wherein the first coefficient of thermal expansion is substantially identical to the second coefficient of thermal expansion. The micromachined structure comprises an annular resonator disposed over the membrane and comprising a first electrode, a second electrode and a piezoelectric layer between the first and second electrodes.

In accordance with another illustrative embodiment, a method of fabricating a piezoelectric micromachined transducer (PMT) comprises: providing a substrate comprising a surface and an opposing surface; forming a cavity in the substrate; forming a membrane layer over the surface and substantially spanning the cavity; and forming an annular transducer over the membrane layer, the annular transducer comprising a first electrode, a second electrode and a piezoelectric layer between the first electrode and the second electrode.

In accordance with another illustrative embodiment, a piezoelectric micromachined transducer (PMT) array comprises a substrate and a plurality of PMTs arranged over the substrate. Each of the PMTs comprises a cavity in the substrate; a membrane layer disposed over the substrate and spanning the cavity; and an annular resonator disposed over the membrane. The annular resonator comprises a first electrode, a second electrode and a piezoelectric layer between the first and second electrodes.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1:
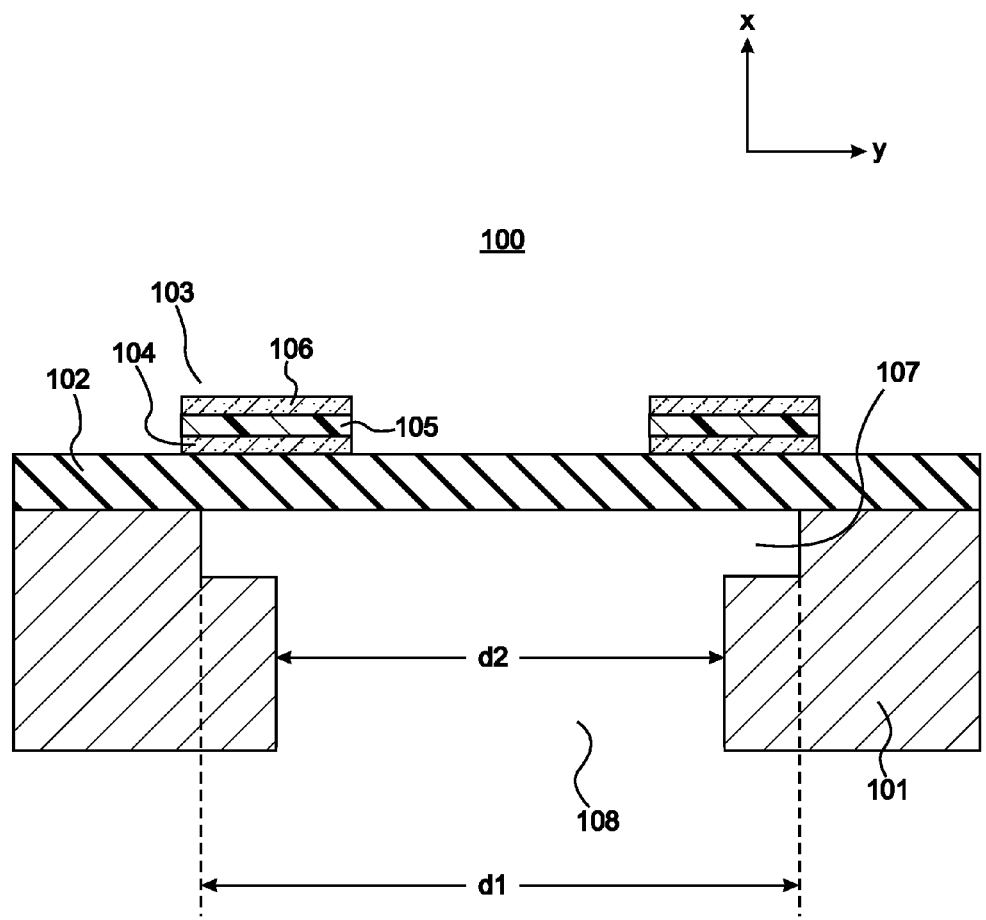
FIG. 1 shows a cross-sectional view of a PMT in accordance with a representative embodiment.

The terms 'a' or 'an', as used herein are defined as one or more than one.

The term 'plurality' as used herein is defined as two or more than two.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of materials and methods may be omitted so as to avoid obscuring the description of the illustrative embodiments. Nonetheless, such materials and methods that are within the purview of one of ordinary skill in the art may be used in accordance with the illustrative embodiments. Such materials and methods are clearly within the scope of the present teachings. The piezoelectric transducers of the representative embodiments are contemplated for use in a variety of electronic devices.

A representative electronic device may be a portable device such as a mobile phone, a camera, a video camera, a personal digital assistant (PDA), a sound recording device, a laptop computer, a tablet computer, a handheld computer, a handheld remote, or an electronic device that comprises the functionality of one or more of these devices. Moreover, the piezoelectric transducers of the representative embodiments are contemplated for use in disparate applications such as industrial automation, (e.g., liquid level sensing), detecting the presence of an object, and measuring gas flow. Additionally, the piezoelectric transducers of the representative embodiments can be used to detect mis-feed in automatic paper feeders in printers and scanners.

It is emphasized that the noted devices are merely illustrative and that other devices are contemplated. In some representative embodiments, the electronic device is a device that benefits from a microphone structure having a plurality of microphones, with at least one microphone optionally being adapted to function in more than one mode.

In many representative embodiments, the electronic devices are portable. However, this is not essential. In particular, the microphone structures of the present teachings are also contemplated for use in devices/apparatuses that are stationary; and devices/apparatuses that are mobile, but are not ordinarily small enough to be considered portable. For example, the microphone structures of representative embodiments may be used in industrial machinery applications, motor vehicle applications, aircraft applications, and watercraft applications, to name only a few.

Additionally, while the present description is drawn primarily to microphones, the present teachings contemplate applications to transducers in general. For example, as one of ordinary skill in the art will readily appreciate, the present teachings may be applied to piezoelectric speakers.

FIG. 1 is a cross-sectional view of a PMT 100 in accordance with an illustrative embodiment. The PMT 100 comprises a substrate 101, a membrane layer 102 and an annular resonator 103. The annular resonator 103 comprises a first electrode 104 disposed over the membrane layer 102, a piezoelectric layer 105 and a second electrode 105. The PMT 100 also comprises a cavity 107 formed in the substrate 101. Application of a time-dependent voltage to the annular resonator 103 causes a mechanical wave to be launched through the annular resonator 103 and the membrane layer 102. As the piezoelectric layer 105 oscillates in response to a mechanical perturbation (e.g., a sound wave), the forces generated by the perturbation induce stresses in the piezoelectric layer resulting in generation of a voltage difference across the electrodes 104, 106. Assuming the layer 105 of piezoelectric material (e.g., AlN, ZnO or lead zirconium titanate (PZT)) has a c-axis substantially orthogonal to the membrane surface (parallel to x in the coordinate system shown), the voltage sensitivity is proportional to the lateral stress, $\sigma_y$, and the ratio of the piezoelectric strain matrix coefficient ($d_{31}$) and the electric permittivity coefficient ($\epsilon_{33}$). In certain embodiments the mechanical wave creates a flexure mode to be launched in the membrane layer 102.

The membrane layer 102 illustratively comprises a material having a thermal expansion coefficient ($T_{CE}$) that substantially matches the thermal expansion coefficient ($T_{CE}$) of the substrate 101. The membrane layer 102 has a thickness equal to or greater than the thickness of the combined thickness of the layers of the annular resonator 103. Notably, substrate 101 and the membrane layer 102 dominate the temperature characteristics of the PMT 100. Moreover, the areal dimension of the annular resonator 103 comprising the first electrode 104, the piezoelectric layer 105 and the second electrode 105 is beneficially less than the areal dimension of the membrane layer 102, so that the impact of the resonator 103 on the thermal properties of the PMT 100 is comparatively small, if not negligible.

In accordance with a representative embodiment, the annular resonator 103 has a circular shape. This is merely illustratively, and other shapes are clearly contemplated. For example, the annular resonator 103 may be elliptical, square or generally polygonal, such as pentagonal. In accordance with a representative embodiment, the substrate 101 is monocrystalline silicon, and the membrane layer 102 comprises monocrystalline silicon; or polycrystalline silicon (polysilicon) formed by low pressure chemical vapor deposition (LPCVD) or by plasma enhanced chemical vapor deposition (PECVD); or silicon carbide (SiC); or silicon nitride $Si_3N_4$. In other embodiments, the substrate 101 is monocrystalline silicon and the membrane layer 103 comprises boron-doped silicon glass (borosilicate glass) with a boron concentration by weight of approximately 3.0% to approximately 6.0%. In other embodiments, the substrate 101 may comprise silicon-on-insulator (SOD, or may comprise a first silicon wafer bonded to a second silicon wafer, which is thinned by a known thinning process to provide a desired thickness of the substrate 101.

Selection of the material for the membrane layer 102 and its thickness allows for the selection of the resonance frequency and sensitivity of the membrane over a selected temperature range. Notably, a change in temperature will result in a change in the stress in the membrane layer 102. In turn, a change in the stress in the material will result in a change in the resonance frequency and the sensitivity of the membrane layer 102. Selection of a material that substantially matches the thermal expansion coefficient ($T_{CE}$) of the substrate 101 will ensure that thermally induced stress in the material used for the membrane 102 will be predictable over a temperature range of interest. Specifically, because the material selected for the membrane layer 102 has a thermal expansion coefficient ($T_{CE}$) that substantially matches the thermal expansion coefficient ($T_{CE}$) of the substrate 101, the substrate 101 and the membrane layer 102 expand and contract at substantially the same rate versus temperature. As a result, the stress in the membrane layer remains substantially constant with changes in temperature. Accordingly, because the change in stress in the membrane layer 102 due to a change in temperature will alter the resonant frequency of the membrane layer 102 by a predictable amount. Likewise, a change in temperature will alter the sensitivity of the membrane layer 102 to a predictable amount, the sensitivity will change by a predictable amount For purposes of illustration and not limitation, the operating temperature range of the PMT 100 is approximately −40° C. to approximately +60° C. In representative embodiments, this results in a change in the resonant frequency of the membrane layer 102 of approximately −3% to approximately +3%.

In accordance with a representative embodiment, selection of the materials for the substrate 101 and the membrane layer 102 results in a substantially constant resonant frequency and sensitivity of the membrane layer 102. In certain embodiments, the thermal coefficient of expansion ($T_{CE}$) of the membrane layer 102 is greater than the thermal expansion coefficient ($T_{CE}$) of the substrate 101. In such embodiments, as the temperature increases, the stress in the membrane layer 102 becomes more compressive; and when the temperature decreases, the stress in the membrane layer 102 becomes more tensile. In other embodiments, the thermal coefficient of expansion ($T_{CE}$) of the membrane layer 102 is less than the thermal expansion coefficient ($T_{CE}$) of the substrate 101. In such embodiments, as the temperature increases, the stress in the membrane layer 102 becomes more tensile; and when the temperature decreases, the stress in the membrane layer 102 becomes more compressive.

Mechanical waves launched from or incident on the membrane layer 103 travel through a cavity 107 and an opening 108. In a representative embodiment, a micromachined structure comprises the substrate 101 and the membrane layer 102 spanning the cavity 107. Notably, the annular resonator 103 disposed over the membrane layer 102 is merely illustrative, and use of other resonator structures disposed over the membrane layer 102 of the micromachined structure are contemplated.

In another representative embodiment, the opening 108 is foregone. In this embodiment, the annular resonator 103 is provided over the cavity 107. In this case the acoustic waves are incident on and radiated away from the front surface of the membrane layer 102.

The cavity 107 spans a distance d1 as shown in FIG. 1. This distance creates the boundary conditions for the equations of motion of the membrane layer 102; with the ends of the cavity 107 defined by the distance d1 and thereby the active region of the membrane 102. As should be appreciated by one of ordinary skill in the art, the fundamental flexure mode is determined in part by the distance d1. Accordingly, the present teachings beneficially contemplate forming the dimension d1 and the dimensions of the cavity 107 generally with precision to provide a particular fundamental flexure mode in the membrane, and thereby a desired fundamental frequency of operation.

In a representative embodiment, the areal shape of the cavity 107 and thus the membrane is circular, and thus the dimension d1 is a diameter. This is merely illustrative, and the membrane may be of other areal shapes including a square, or an ellipse. Notably, the areal shape of the annular resonator 103 may be substantially the same as that of the cavity 107, or of a different annular shape than that of the cavity 107. In either case, the annular resonator 103 is disposed over the membrane layer 102 and the cavity 107. The opening 108 spans a distance d2, and comprises an areal shape that may be substantially same as to that of the cavity 107 or may be different than the areal shape of the cavity 107. The distance d2 is less than or equal to the distance d1, as the areal dimensions of the opening 108 cannot be greater than the areal dimensions of the cavity. To this end, as described below fabrication of the cavity 107 is comparatively precise and reproducible so that a membrane of a desired fundamental flexure mode can be realized in a repeatable manner. By contrast, the opening 108 is fabricated by less precise methods and, as such, if the areal dimension of opening 108 is greater than that of the cavity 107, the precision of the membrane is controlled by the fabrication of the opening 108 and not the cavity. As such, the precision and reproducibility of the membrane is compromised. Notably, a known etching technique, the Bosch etching method, may be used to etch the opening 108. If cavity 107 were not present, cavity 108 then would define d1. Using the Bosch method alone to form the opening 108 without the cavity 107, there would be comparatively high uncertainty in the dimension d1. For a typical process, this would be greater than 10 μm. However, by etching the cavity 107 as described above, and then etching the opening 108, d1 can be fabricated with a precision of 1 μm or less, or approximately ten times more precisely than use of the Bosch method alone.

The annular resonator 103 disposed over the cavity 107 includes characteristics of a film bulk acoustic resonator (FBAR), such as described in patents and patent publications referenced below. While one resonator stack (i.e., first electrode 104, the piezoelectric layer 105 and the second electrode 106) is shown, more than one resonator stack is contemplated. For example, another resonator stack comprising the first and second electrodes 104, 106 and the piezoelectric layer 103 may be provided over the resonator stack shown in FIG. 1. This structure has similar characteristics as a stack bulk acoustic resonator (SBAR). The SBAR is fabricated by repeating the fabrication sequence of the resonator stack after forming the resonator stack shown in FIG. 1, and before removing sacrificial material as discussed below.

FIGS. 2A-2F shows cross-sectional views of a fabrication sequence in accordance with a representative embodiment. Methods, materials and structures of the PMT 100 may be as described in commonly owned U.S. Patent Application Publications: 20080122320 and 20080122317 to Fazzio, et al.; 20070205850 to Jamneala, et al.; 20080258842 to Ruby, et al.; and 20060103492 to Feng, et al.; and may be as described in commonly owned U.S. Pat. Nos. 5,587,620; 5,873,153; 6,384,697; 6,507,983; and 7,275,292 to Ruby, et al.; 6,828, 713 to Bradley, et. al. The disclosures of these patents and patent application publications are specifically incorporated herein by reference. Notably, the teachings of these patents and patent publications is intended to be illustrative of methods, materials and structures useful to the present teachings, but in no way limiting to the present teachings.

Figure 2A:
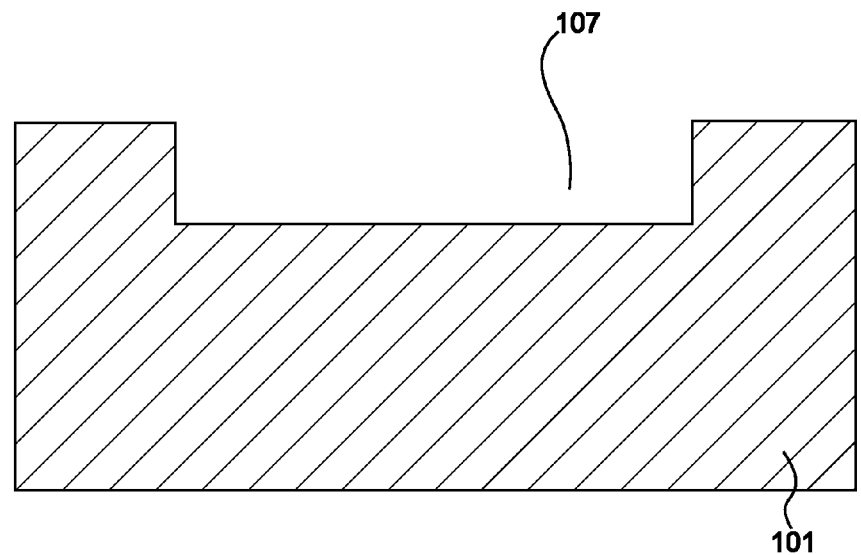
FIGS. 2A-2F shows cross-sectional views of a fabrication sequence in accordance with a representative embodiment.

FIG. 2A shows the substrate 101 having the cavity 107 formed therein by a known method. In a representative embodiment, the substrate 101 comprises silicon, and the cavity 107 is formed by a known wet etching or dry etching techniques. Additional details of the method of fabricating the cavity 107 are described in the incorporated patents and patent publications. Regardless of the method selected for fabricating the cavity 107, the degree of precision in the dimensions of the cavity 107 and its reproducibility in large scale allows the setting of and consistency of the resonant frequency of the PMT 100.

Figure 2B:
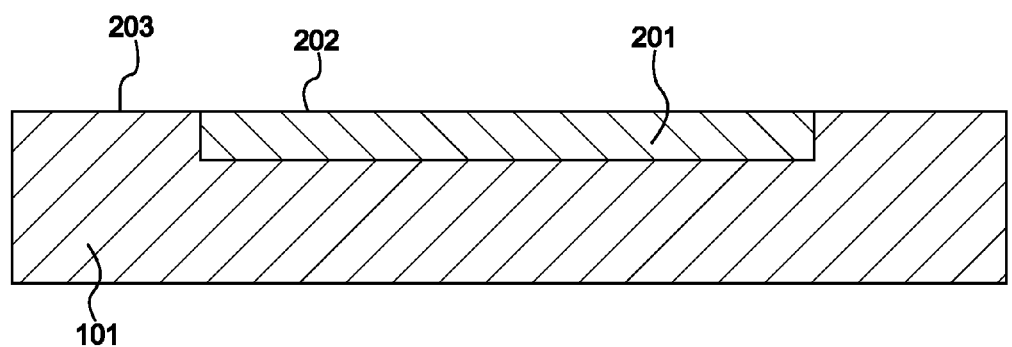
Figure 2C:
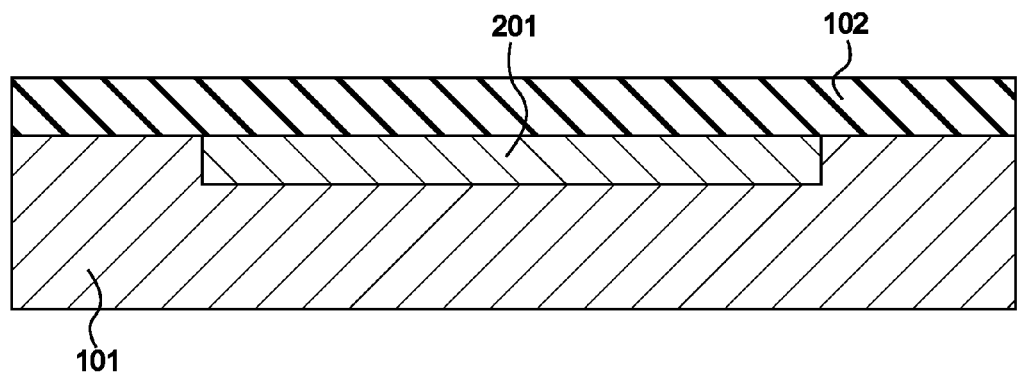

FIG. 2B shows the substrate 101, having the cavity 107 substantially filled with a sacrificial material 201. As described in the incorporated patents and patent publications, the sacrificial material is illustratively silicon dioxide ($SiO_2$) or phosphosilicate glass (PSG) formed using a known deposition or growth method. After the sacrificial layer 201 is provided in the cavity 107, a polishing step, such as chemical mechanical polishing (CMP) is performed so that a surface 202 of the sacrificial layer 201 is substantially flush with a surface 203 of the substrate 101. FIG. 2C shows the substrate 101 after the forming of the membrane layer 102. In accordance with a representative embodiment, the membrane layer 102 comprises boron doped $SiO_2$ commonly referred to as borosilicate glass (BSG). In other representative embodiments, the membrane layer 102 comprises one of polysilicon (poly-Si), or silicon nitride ($Si_3N_4$) or silicon carbide (SiC). These materials are merely illustrative, and other materials are contemplated for use as the membrane layer 102. Notably, the material selected for the membrane 102 should be reproducibly fabricated with consistent desired material properties such as film stress and thickness in an array of PMTs 100 or across a wafer in large-scale fabrication). Accordingly, to realize sufficient accuracy in the resonant frequency, and reproducibility from one transducer (PMT) to the next in fabrication, it is important to control the thickness of the membrane layer 102 and the film stress of the membrane layer 102. In choosing the material, other parameters of interest are stiffness, robustness, environmental compatibility. Illustratively, a layer of BSG having a thickness in the range of approximately 0.1 µm to approximately 20.0 µm may be used for the membrane layer 102.

Regardless of the material selected for the membrane layer 102, formation of this layer is effected by a known method and with considerations for other processes used in the fabrication of the PMT 100.

Figure 2D:
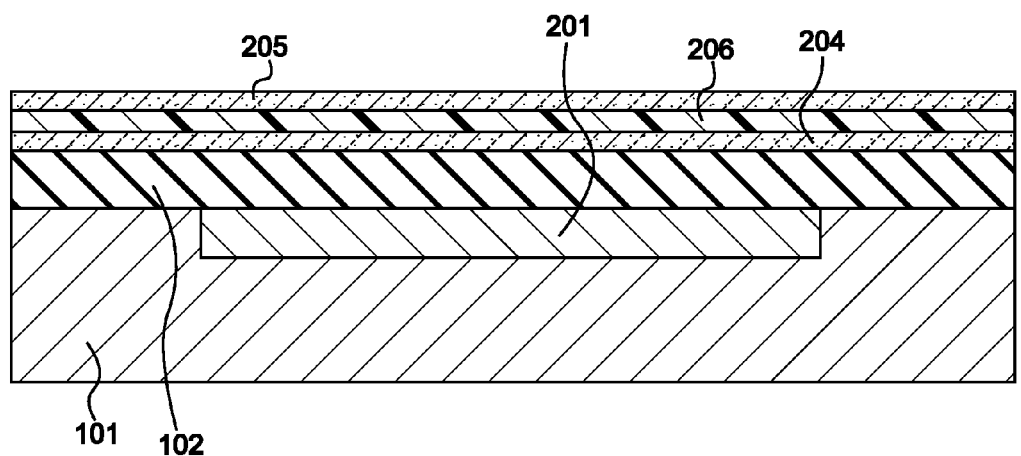

FIG. 2D shows the substrate 101 after the forming of a first conductive layer 204, a piezoelectric layer 205 and a second conductive layer 206 are provided over the membrane layer 102. These layers are formed using known methods and materials, such as described in one or more the incorporated U.S. Patents and Patent Publications, and are not repeated so as to avoid obscuring the description of the present embodiments.

Figure 2E:
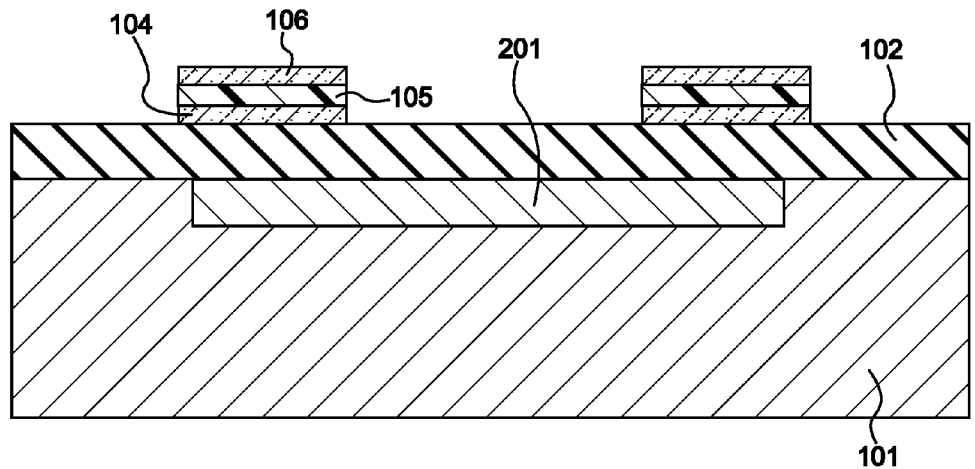

FIG. 2E shows the substrate 101 after the patterning and etching of the first conductive layer 204, the piezoelectric layer 205 and the second conductive layer 206 to provide the annular resonator 103 comprising the first electrode 104, the piezoelectric layer 105 and the second electrode 106 over the membrane layer 102. As described in connection with the embodiment of FIG. 1, the annular resonator 103 may be circular in areal shape, or may be square in areal shape, or may be other than circular or square in areal shape. Regardless of the areal shape of the annular resonator 103, the fabrication of the first electrode 104, the second electrode 106 and the piezoelectric layer 105 illustratively may be effected according to the teachings of U.S. Patent Application Publications: 20080122320 and 20080122317 to Fazzio, et al.

Figure 2F:
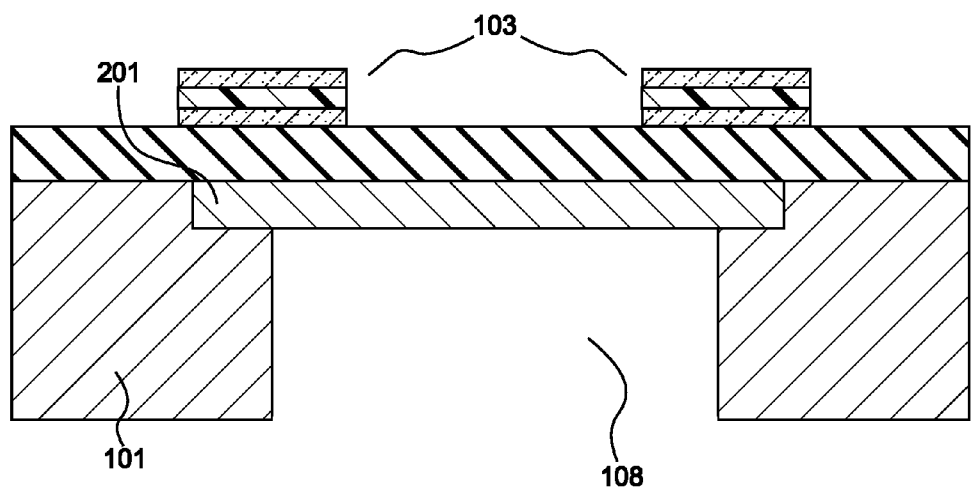

FIG. 2F shows the substrate 101 after etching to form the opening 108. The etching of the substrate to form the opening 108 is illustratively effected by deep reactive ion etching (DRIE), or the so-called Bosch Method. Alternatively a wet etch commensurate for use with the remaining materials shown in FIG. 2E may be used to provide the opening 108. After completion of the formation of the opening 108, the sacrificial layer 201 is removed according to a known method, for example as described in one or more of the incorporated above. After the removal of the sacrificial layer, the PMT 100 shown in FIG. 1 is realized.

Figure 3:
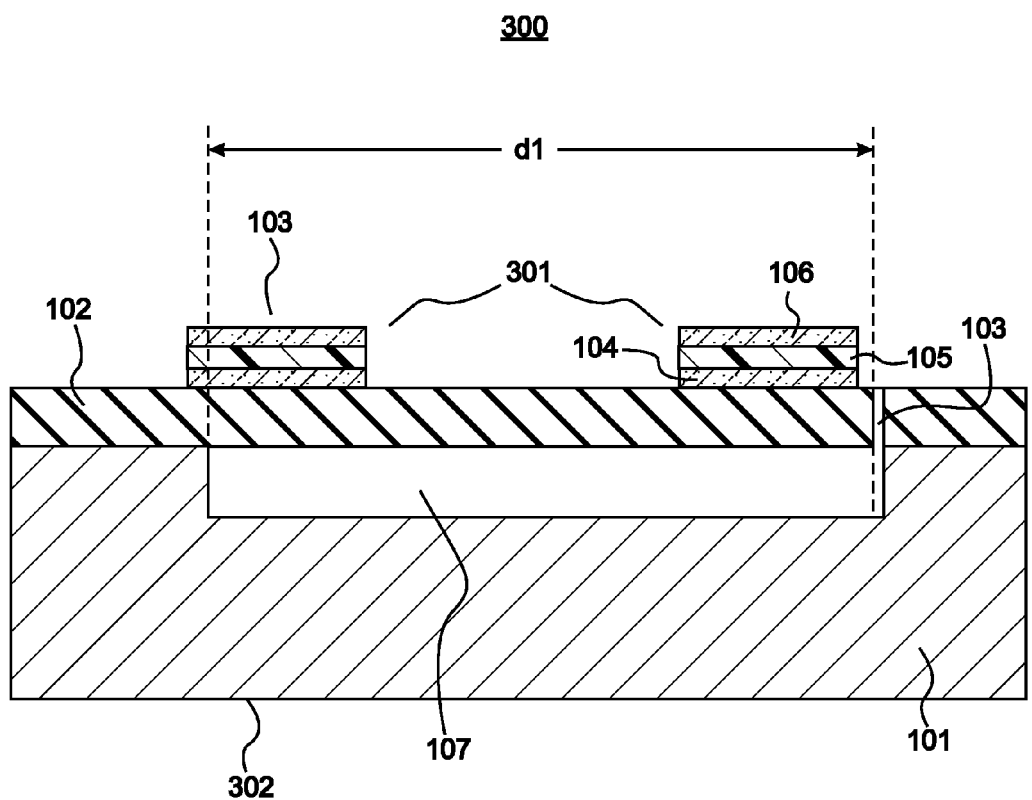
FIG. 3 shows a cross-sectional view of a PMT in accordance with a representative embodiment.

FIG. 3 shows a PMT 300 in cross-section in accordance with a representative. Many of the features, materials and methods of fabricating the PMT 300 are common to those above provided in connection with the embodiments of FIGS. 1-2F. Generally, common details are not repeated to avoid obscuring the description of the presently described embodiments.

The PMT 300 comprises the substrate 101 substrate 101, the membrane layer 102 and the annular resonator 103. The annular resonator 103 comprises the first electrode 104 disposed over the membrane layer 102, the piezoelectric layer 105 and the second electrode 105.

The PMT 300 also comprises the cavity 107 formed in the substrate 101. The PMT 300 does not comprise the opening 108. Notably, the PMT 300 is designed so that mechanical waves are transmitted to or received from a side 301, which is the side of the PMT 300 opposing a backside surface 302 of the substrate 101. In order to facilitate a flexure mode of a suitable amplitude in the membrane layer 102, a vent 303 is provided to foster pressure equalization between the pressures on each side of the membrane layer 102. Thus, the vent 303 promotes equal pressure in the cavity 107 as in the ambient region of the PMT 300.

Application of a time-dependent voltage to the annular resonator 103 causes a mechanical wave to be launched through the annular resonator 103 and the membrane layer 102. As the piezoelectric layer 105 oscillates in response to a mechanical perturbation (e.g., a sound wave), the forces generated by the perturbation induce stresses in the piezoelectric layer resulting in generation of a voltage difference across the electrodes 104, 106. Assuming the layer 105 of piezoelectric material (e.g., AlN, ZnO or lead zirconium titanate (PZT)) has a c-axis substantially orthogonal to the membrane surface (parallel to x in the coordinate system shown), the voltage sensitivity is proportional to the lateral stress, $\sigma_y$, and the ratio of the piezoelectric strain matrix coefficient ($d_{31}$) and the electric permittivity coefficient ($\epsilon_{33}$). Beneficially, the mechanical wave creates a flexure mode to be launched in the membrane layer 102. Mechanical waves launched from or incident on the membrane layer travel from side 301. The cavity 107 spans a distance d1 as shown in FIG. 3, and comprises the active area of the membrane of the PMT 300. Similarly, in a receiving mode, mechanical waves incident on an annular resonator are converted into flexural modes in the layer 105 and to time-dependent voltages due to the piezoelectric affect. Receiver electronics (not shown) then process the voltage signals.

Figure 4A:
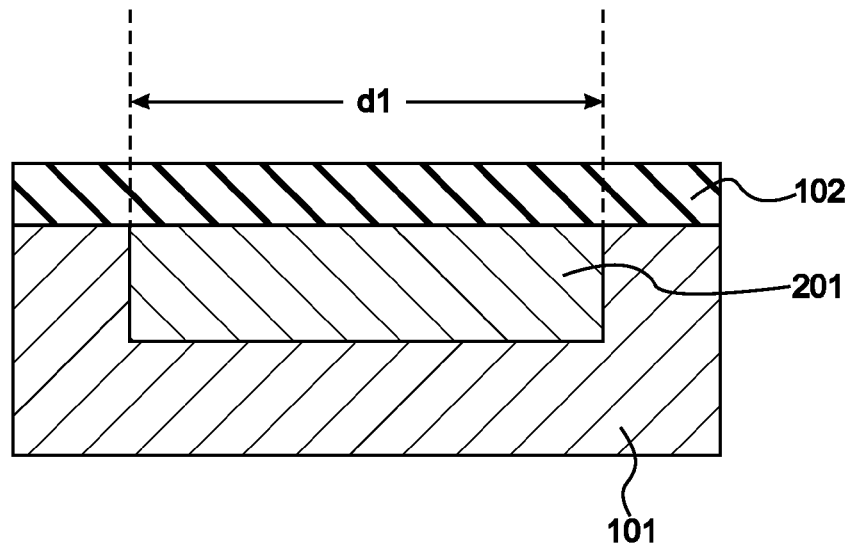
FIGS. 4A-4C show a fabrication sequence of a PMT in cross-section and top view in accordance with a representative embodiment.
Figure 4B:
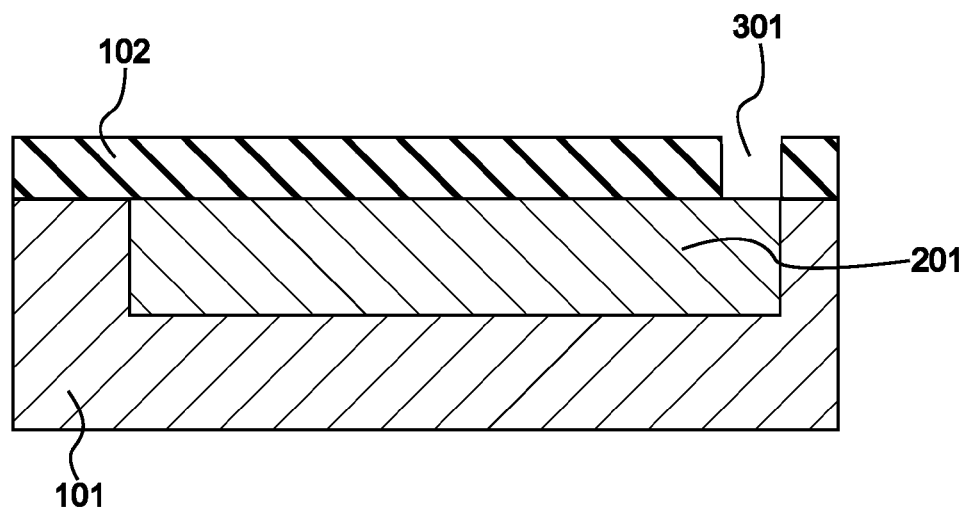

FIG. 4A shows in cross-section the substrate 101 comprising the cavity 107 filled with the sacrificial layer 201. The CMP step described above has been completed, and the membrane layer 102 has been provided over the substrate 101 and sacrificial layer 201. FIG. 4B shows in cross-section the substrate 101 comprising the cavity 107 filled with the sacrificial layer 201, after forming of the vent 303. The vent 303 is formed by a known patterning and etching method, and may be fabricated for example as described in U.S. Pat. No. 6,384,697. The vent 303 serves several functions in the PMTs of the representative embodiments. Beneficially, the vent 303 serves to equalize pressure on both sides of the membrane layer 1032. In the case where opening 107 is sealed during product assembly, the vent 303 provides and controls the low-frequency behavior of the transducer frequency response. The dimensions and placement of the vent 303 are selected to achieve these and other benefits.

Figure 4C:
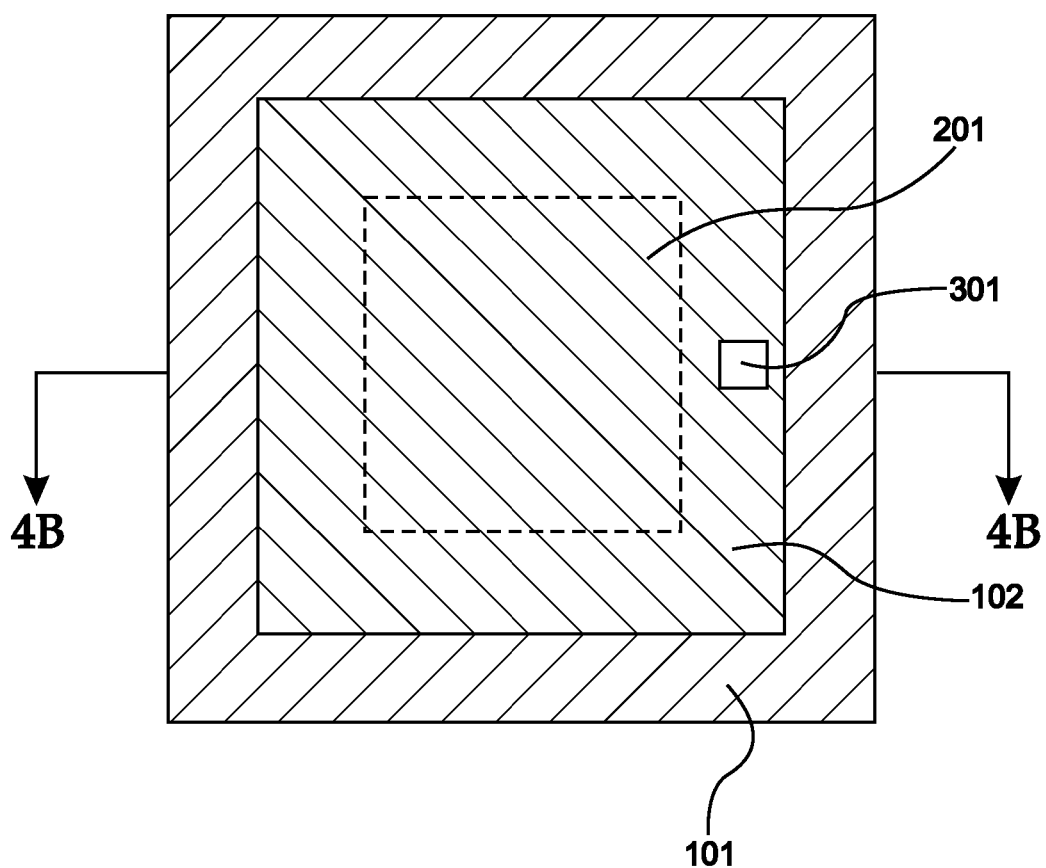

FIG. 4C shows a top view of the substrate 101 comprising the cavity 107 filled with the sacrificial layer 201, after forming of the vent 303, where the section line 4B-4B denotes the perspective of FIG. 4B. Notably, FIG. 4C shows the structure before forming of the annular resonator 103. Also, as shown, the areal dimension of the cavity 107 is substantially square, although this is merely illustrative, and other areal shapes are contemplated. As noted above, the areal shape of the annual resonator 103 may be of the same areal shape or of a different areal shape that the cavity 107.

Figure 5:
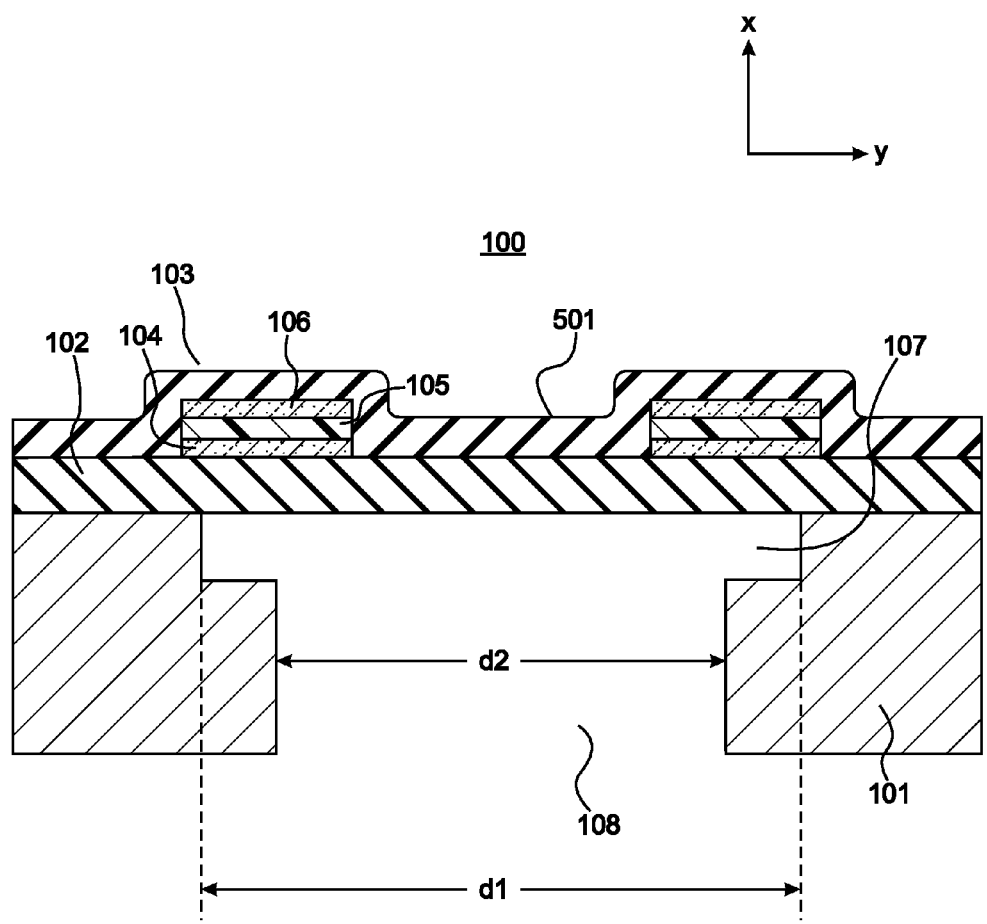
FIG. 5 shows a cross-sectional view of a PMT in accordance with a representative embodiment.

FIG. 5 shows a cross-sectional view of a PMT 500 in accordance with a representative embodiment. The PMT 500 comprises components and materials common to the representative embodiments described in connection with FIGS. 1-4C; and is fabricated by methods described above in connection with these embodiments. Because many of the details of the components, materials and manufacturing methods are common to those described previously, such details are not repeated in order to avoid obscuring the presently described embodiments.

The PMT 500 comprises a passivation layer 501. The passivation layer 501 is provided over a surface of the PMT 100 as shown. Notably, in the representative embodiment, the passivation layer 501 is provided over the membrane 102 and the annular resonator 103, and about the layers thereof.

In representative embodiments, the passivation layer 501 may be SiC or $Si_3N_4$ or BSG, and is deposited by a selected known method. Illustratively, the passivation layer 501 has a thickness of approximately 1000 Angstroms to approximately 5000 Angstroms. In accordance with certain representative embodiments, the passivation layer 501 is selected to have a thermal expansion coefficient ($T_{CE}$) that substantially matches the thermal expansion coefficient ($T_{CE}$) of the membrane layer 102 and the substrate 101. In certain embodiments, the material selected for the passivation layer 501 is substantially identical to that of the membrane layer 102.

As will be appreciated by one of ordinary skill in the art, many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A micromachined structure, comprising:
a substrate having a first coefficient of thermal expansion;
a cavity in the substrate; and
a membrane layer having a second coefficient of thermal expansion and disposed over the substrate and spanning the cavity, wherein the first coefficient of thermal expansion is substantially identical to the second coefficient of thermal expansion; and
an annular resonator disposed over the membrane and comprising a first electrode, a second electrode and a piezoelectric layer between the first and second electrodes.

2. A micromachined structure as claimed in claim 1, wherein the membrane layer has a thickness that is greater than a combined thickness of the first electrode, the second electrode and the piezoelectric layer.

3. A micromachined structure as claimed in claim 1, wherein the membrane layer comprises borosilicate glass (BSG).

4. A micromachined structure as claimed in claim 1, wherein the cavity spans a first width and is provided in a surface of the substrate, and the micromachined structure further comprises an opening in the substrate that spans a second width in an opposing surface of the substrate.

5. A micromachined structure as claimed in claim 1, wherein the membrane layer is provided over a surface of the substrate, and the substrate comprises an opposing surface, and the micromachined structure further comprises a vent between the cavity and the surface of the substrate.

6. A micromachined structure as claimed in claim 4, wherein the opening is disposed on tandem with the cavity.

7. A micromachined structure as claimed in claim 1, wherein the membrane layer comprises one of: polysilicon (poly-Si), or silicon nitride ($Si_3N_4$) or silicon carbide (SiC), or monocrystalline silicon.

8. A micromachined structure as claimed in claim 2, wherein the first and second electrodes of the annular resonator are substantially circular.

9. A micromachined structure as claimed in claim 2, wherein the first and second electrodes of the annular resonator are substantially square.

10. A piezoelectric micromachined transducer (PMT) array, comprising:
a substrate;
a plurality of PMTs arranged over the substrate, each of the PMTs comprising:
a cavity in the substrate;
membrane layer disposed over the substrate and spanning the cavity;
an annular resonator disposed over the membrane and comprising a first electrode, a second electrode and a piezoelectric layer between the first and second electrodes.

11. A PMT array as claimed in claim 10, wherein cavity of at least one of the PMTs spans a first width and is provided in a surface of the substrate, and the at least one PMT further comprises an opening in the substrate that spans a second width in an opposing surface of the substrate.

12. A PMT array as claimed in claim 10, wherein the membrane layer of at least one of the PMTs is provided over a surface of the substrate, and the substrate comprises an opposing surface, and the at least one PMT further comprises a vent between the cavity and the surface of the substrate.

13. A PMT array as claimed in claim 12, wherein the membrane layer comprises borosilicate glass (BSG).

* * * * *